United States Patent [19]

Amick et al.

[11] Patent Number: 5,320,684
[45] Date of Patent: Jun. 14, 1994

[54] SOLAR CELL AND METHOD OF MAKING SAME

[75] Inventors: James Amick, Princeton, N.J.; Frank J. Bottari, Acton; Jack I. Hanoka, Brookline, both of Mass.

[73] Assignee: Mobil Solar Energy Corporation, Billerica, Mass.

[21] Appl. No.: 889,121

[22] Filed: May 27, 1992

[51] Int. Cl.$^5$ .................... H01L 31/06; H01L 31/18
[52] U.S. Cl. ........................................ 136/256; 437/2
[58] Field of Search .................. 136/256, 255, 259; 437/2-5, 194, 202

[56] References Cited

U.S. PATENT DOCUMENTS

| | | | |
|---|---|---|---|
| 3,888,698 | 6/1975 | Lindmayer et al. | 136/256 |
| 4,375,007 | 2/1983 | Marcus | 136/256 |
| 4,737,197 | 4/1988 | Nagahara | 136/256 |
| 4,828,628 | 5/1989 | Hezel et al. | 136/255 |
| 4,869,755 | 9/1989 | Huschka et al. | 136/259 |

OTHER PUBLICATIONS

PCT International Publication No. WO 92/02952 (Feb. 20, 1992).
PCT International Publication No. WO 89/12321 (Dec. 14, 1989).
U.S. Patent Appln. 666,334 filed 7 Mar. 1991 entitled "Method and Apparatus for Forming Contacts".
International Publication No. WO 92/05587 (Apr. 2, 1992).
Chaudhuri et al., International Publication No. WO 89/00341 (Jan. 12, 1989).
Narayanan et al., "17.8-Percent Efficiency Polycrystalline Silicon Solar Cells", IEEE Transactions on Electron Devices vol. 37, No. 2 Feb. 1990, pp. 382-384.
Narayanan & Green, "Improvement in the Open-Circuit voltage and Efficiency of Silicon Solar Cells by Rear Aluminum Treatment", vol. 26 (1989) pp. 329-334.
Gay, "Thin Solar Cell Performance Characteristics", 13th *IEEE Proceedings* (1975), pp. 444-449.
Cheek et al., "Thick-Film Metallization for Solar Cell Applications", *IEEE Trans on Electron Devices*, vol. ED-31, No. 5 (1984), pp. 602-609.
Nunoi et al., "High Performance BSF Silicon Solar Cell with Fire through Contacts Printed on AR Coating", IEEE 1980 pp. 805-810.
Emery et al., "Electro-Optical Properties of Screen Printed Solar Cells", IEEE (1982), pp. 947-951.
Field et al., "Application of Thick-Film Technology to Solar Cell Fabrication", IEEE, pp. 303-308 (1976).
Godfrey et al., "An advanced Solar Cell Production Line Based on LSSA Funded Processes", 15th IEEE, 1982, pp. 892-894.
Sardi et al., "Some Features of Thick Film Technology for the Back Metallization of Solar Cells", *Solar Cells*, vol. 11 (1984) pp. 51-67.

*Primary Examiner*—Aaron Weisstuch
*Attorney, Agent, or Firm*—Pandiscio & Pandiscio

[57] ABSTRACT

An improved photovoltaic cell and a method for making such cells is provided. In a generic sense, the preferred method comprises the step of (1) applying a coating of an aluminum metal paste onto the rear surface of the substrate in a suitable rear contact pattern, (2) applying a layer of a glass frit paste so as to envelop the rear contact, and (3) firing those pastes so as to form a rear contact protected by a glass overcoating. A front contact also is formed by applying a silver metal/glass frit paste onto the anti-reflection coating in a related front contact pattern. The front and rear contacts may be fired simultaneously or in two different steps. However, a single firing method is preferred because thicker aluminum contacts are possible.

In a preferred embodiment, the cell provided by the invention includes (1) a silicon substrate having a shallow p-n junction adjacent its front surface, (2) a plurality of silver soldering pads bonded to the rear surface of the substrate, (3) an aluminum contact on the rear surface of the substrate having openings that expose at least portions of said silver pads, (4) a silver contact surrounded by an anti-reflection coating on the front surface of the substrate, and (5) a glass layer overlying the aluminum contact so as to protect it against oxidation and corrosion. The glass layer has windows exposing portions of the soldering pads for solder attachment of connecting wire ribbons.

43 Claims, 6 Drawing Sheets

SOLAR CELL AND METHOD OF MAKING SAME

BACKGROUND

1. Field of Invention

The present invention generally relates to photovoltaic cells. More particularly, the invention relates to the formation and protection of metallization layers on such photovoltaic cells.

2. Summary of the Prior Art

Silicon photovoltaic cells essentially comprise a semiconductor substrate of one conductivity type having a shallow p-n junction formed adjacent one surface thereof.

One method of making photovoltaic solar cells involves provision of semiconductor substrates in the form of flat sheets or wafers having a shallow p-n junction adjacent one surface thereof (commonly called the "front surface"). Such substrates, which may include an insulating anti-reflection ("AR") coating on their front surfaces, are commonly referred to as "solar cell blanks". The anti-reflection coating is transparent to solar radiation. In the case of silicon solar cells, the AR coating is often made of silicon nitride or an oxide of silicon or titanium. Preferably, but not necessarily, the silicon nitride is formed by a plasma deposition process.

A typical solar cell blank may take the form of a rectangular EFG-grown silicon substrate of p-type conductivity having a thickness in the range of 0.012 to 0.016 inches and a p-n junction located about 0.5 microns from its front surface, and also having a silicon nitride coating about 800 Angstroms thick covering its front surface. Equivalent solar cell blanks also are well known, e.g. those comprising single crystal silicon substrates and cast polycrystalline silicon substrates.

The cells require electrical contacts (sometimes referred to as "electrodes") on both the front and rear sides of the semiconductor substrate in order to be able to recover an electrical current from the cells when they are exposed to solar radiation. These contacts are typically made of aluminum, silver, or nickel. For example, a common arrangement with solar cells having a silicon substrate is to make the rear contact of aluminum and the front contact of silver.

The contact on the front surface of the cell is generally made in the form of a grid, comprising an array of narrow fingers and at least one elongate bus that intersects the fingers. The width, number, and arrangement of the fingers is such that the area of the front surface adapted for exposure to solar radiation is maximized. Further to improve the conversion efficiency of the cell, an AR coating as described above is applied at least to those areas of the first side of the cell that are not covered by the front contact.

Aluminum is preferred for the rear contact for cost and other reasons. The rear contact may cover the entire rear surface of the solar cell blank, but more commonly it is formed so as to terminate close to but short of the edges of the blank. However, the exposed surface of an aluminum contact tends to oxidize in air, making soldering difficult. Therefore, to facilitate soldering, it has been found useful additionally to provide apertures in the aluminum coating, with silver soldering pads being formed in those apertures so as to slightly overlap the adjacent aluminum layer. These silver pads form ohmic bonds with the underlying substrate and also low resistance electrical connections with the aluminum contact, and are used as sites for soldering the connecting copper ribbons to the rear contact. This latter arrangement is more efficient than soldering the copper ribbons directly to the aluminum contact. Such a contact arrangement is disclosed in PCT International Publication No. WO 92/02952, based on U.S. patent application Ser. No. 07/561,101, filed Sep. 1, 1990 by Frank Bottari et al for "Method Of Applying Metallized Contacts To A Solar Cell" (U.S. Pat. No. 5,151,386, issued 29 Sep. 1992). The front and rear contacts may be formed in various ways, but preferably they are formed by a paste printing/firing technique which involves printing a selected metal-containing paste or ink onto each surface of the solar cell blank and then firing that paste or ink in a suitable predetermined atmosphere so as to cause the metal constituent of the paste or ink to bond to the blank and form an ohmic contact therewith. The paste or ink comprises an organic vehicle in which particles of the selected metal are dispersed, and the firing is conducted so that the vehicle's components are removed by evaporation and/or pyrolysis.

The printing may be conducted in various ways, e.g., by silk screen printing, ad printing or direct write printing techniques. One suitable pad printing technique is disclosed in PCT International Publication No. WO 92/02952, supra. U.S. patent Application Ser. No. 666,334, filed 7 Mar. 1991 by Jack I. Hanoka and Scott E. Danielson for "Method And Apparatus For Forming Contacts" (U.S. Pat. No. 5,151,377, issued 29 Sep. 1992), discloses an improve method for direct writing a thick ink film onto the front surface of a solar cell blank. The teaching of those patents are incorporated herein by the foregoing reference thereto.

For purposes of clarification and definiteness, as used herein the terms "ink" and paste" are to be construed as essentially synonymous terms for describing fluid printing materials since they are used interchangeably by persons skilled in the art, although the term "ink" suggests a lower viscosity than the term "paste". In this connection, it is to be appreciated that the viscosity of the fluid material is adjusted according to the manner in which it is applied, e.g., silk screen printing, pad printing, and direct write printing. Also, the terms "metal paste" and "metal ink" are to be construed as denoting a metal-rich fluid comprising a selected metal in the form of discrete particles dispersed in an organic vehicle that is removable or destroyable on heating, e.g., via evaporation and/or pyrolysis. The metal paste may optionally contain a glass frit. The vehicle typically comprises an organic binder and a solvent of suitable properties, e.g., ethyl or methyl cellulose and Carbitol or terpineol. Thus, the term "aluminum metal paste" is to be construed as denoting a fluid aluminum-rich composition comprising aluminum particles dispersed in an organic vehicle. Further, the term "glass frit paste" denotes fluid compositions comprising a selected glass frit dispersed in an organic vehicle of the type previously described, and the term "metal/glass frit paste", e.g., a silver metal/glass frit paste, is to b construed as a metal paste that essentially comprise a selected glass frit in a predetermined amount on a eight percent basis.

Heretofore a preferred method of forming aluminum back contacts by the paste printing/firing technique has been to coat the rear side of the solar cell blank with an aluminum metal paste co-rising an aluminum powder dispersed in an organic vehicle so that the total weight of the aluminum powder in the paste applied to the blank is between bout 0.8–2.0 mg/cm$^2$ of coated substrate surface, and then firing that material (with or without a previous drying procedure) in a non-oxidizing atmosphere, e.g., nitrogen, under conditions adequate to evaporate and/or pyrolyze the organic vehicle and also cause the aluminum to alloy and fuse to the silicon substrate.

The alloying process involve melting the aluminum particles and the adjoining region of the substrate, and then cooling the solar cell lank to effect re-crystallization of the melted region of the substrate. The re-crystallized region comprises silicon highly doped with aluminum. The firing and cooling produces an aluminum contact on the rear surface of the substrate that is mechanically and electrically bonded to the re-crystallized region of the silicon substrate.

The grid-shaped contact on the front surface has been formed in various ways. For example, in some cases the grid contact is formed by a paste printing/firing method, and the covering at least those portions of the front surface of the substrate not covered by the grid contact with an AR coating.

Another approach comprises first coating the semiconductor substrate with an AR coating, and thereafter forming the grid contact. This latter approach has been practiced in two different forms. One way involves chemically etching way portions of the anti-reflection coating so as to expose areas of the front surface of the semiconductor substrate in the desired grid electrode pattern, and then forming the grid contact on the front surface in the region where the anti-reflection coating has been etched away.

The second way of forming the front contact utilizes the so-called "fired-through" method. That method utilizes a solar cell blank having an AR coating on its front surface and comprises the following steps: (1) applying a coating of a metal/glass frit paste to the surface of the AR coating in a predetermined pattern corresponding to the configuration of the desired grid electrode, and (2) heating the coated solar cell blank to a temperature and for a time sufficient to cause the metal/glass frit composition to dissolve and migrate through the anti-reflection coating and then form an ohmic contact with the underlying front surface of the substrate.

The "fired through" method of forming silver contacts is illustrated by PCT Patent Application Publication WO 89/12312, published 14 Dec. 1989, based on U.S. patent application Ser. No. 205,304, filed 10 Jun. 1988 by Jack Hanoka for an "Improved Method of Fabricating Contacts or Solar Cells". The concept of firing metal contact through an anti-reflection dielectric coating also is disclosed in U.S. Pat. No. 4,737,197, issued to Y. Nagahara et al. for "Solar Cell with Paste Contact".

In one prior art method of manufacturing solar cells having aluminum back contacts a so-called "double-fire" process is utilize. In that process, an aluminum metal ink is deposited on the rear surface of a solar cell blank in the desired pattern of the rear contact, the solar cell blank having an AR coating (preferably silicon nitride) on its front surface. Then, the solar cell blank is fired in a nitrogen atmosphere at a temperature and or a time adequate to produce an aluminum contact alloyed to the underlying silicon substrate in the manner described above. Thereafter, a silver metal/glass frit paste is coated onto the AR layer so as to define a suitable grid contact pattern, as discussed above, following which a second firing operation is conducted in air to form a silver grid contact bonded to the front surface of the solar cell blank.

When the double fire process involves forming silver soldering pads in opening in the aluminum back contact, the blocks or segments of silver metal paste used to form the pads are fired at the same time as the silver metal paste used to form the front grid electrode. Typically, the silver metal paste used to form the soldering pads contain a glass frit, a does the silver metal paste used to form the front contact that is fired through the AR coating. See International Application No. PT/US91/06445, filed 6 Sep. 1991 for "Electrical Contacts And Method Of Manufacturing Same", based on U.S. application Ser. No. 586,894, filed 24 Sep. 1990, by David A. St. Angelo et al (U.S. Pat. No. 5,118,362, issued 2 Jun. 1992), which is incorporated herein by reference thereto.

The so-called "double-fire" process is costly because of the steps and equipment involved. Hence, efforts also have been made to develop a successful so-called "single-fire" process in which the aluminum back contact and a grid-like silver front contact are fired simultaneously.

A primary concern of solar cell manufacturers is the need to decrease contact corrosion and increase reliability and useful life of solar cells and solar cell modules and panels. Although solar cell modules, i.e., modules comprising a plurality of solar cells connected in a suitable series and/or parallel circuit matrix, are made so that the solar cells are sealed between substantially rigid front and back support sheets, with at least the front sheet being transparent, the solar cells are subject to deterioration because of some leakage of outside atmosphere through the protective module encapsulation. Such leakage tends to result in cell deterioration, in part by oxidation and corrosion of the aluminum contacts. Oxidation of the aluminum back contact reduces cell efficiency and also shortens the useful life expectancy of the cells an modules.

Moreover, problems have bee encountered in simultaneously firing the paste used to form the silver front contacts and aluminum rear contacts in the same atmosphere. The silver pate must be fired in air. Unfortunately, aluminum oxidation is accelerated when the aluminum-containing coating is fired in an oxygen-containing atmosphere, resulting in a porous aluminum contact on the rear side of the substrate. This porous aluminum metallization tends to degrade rapidly during conventional accelerated testing. Furthermore, there is a strong tendency for the aluminum to form what have been variously referred to as "balls" or "bumps" when fire in air. These anomalies in the rear contact tend to result in an increase in cell breakage in the course of interconnecting and encapsulating a plurality of cells together in a module.

Further, with respect to the single fire process, where silver soldering pads are provided in apertures in the aluminum contact with the silver pads overlapping edge portions of the aluminum layer, it has been found that the silver overlapping the aluminum tends to flake off after firing. Obviously, this poor mechanical adherence between the silver and the aluminum is undesirable.

The prior art also tends to suggest that increasing the thickness of the aluminum contact on the rear side of the solar cell may result in an improvement in overall cell efficiency. The reason for this is not fully understood, but it is believed that since a thicker aluminum contact can be achieved by increasing the amount of aluminum paste applied to the substrate, firing f the thicker paste layer will result in formation of a thicker aluminum metal contact, ad also in formation of a thicker aluminum-rich (P+) region or zone between the aluminum metal contact and the underlying substrate. The latter result provide an improved back surface field, resulting in improved cell efficiency. In this context, what is meant by a "thick" aluminum contact is one with a thickness n the order of 25 microns, in contrast to prior "thin" aluminum contacts which are characterized by a thickness not exceeding about 8 microns. By way of example, a "thick" aluminum contact may be obtained by coating an aluminum paste so as o provide 4.6–8.0 mg of aluminum per $cm^2$ of coated substrate surface, while a "thin" aluminum contact is produced if the past is applied in a thickness providing aluminum in an amount equal to between 0.8–2.3 $mg/cm^2$ of coated substrate surface.

However, it has been determined that providing thick aluminum contacts on thin polycrystalline solar cell blanks, e.g., blanks comprising substrates made by the EFG crystal growth process, s not feasible when using the double fire process, because such thick aluminum contacts have been found to so warp the underlying semi-conductor substrates as a consequence of the double firing as to cause breakage of the cell.

SUMMARY OF THE INVENTION

The present invention is directed to providing improve photovoltaic solar cells by achieving one or more of the following objects:

(1) protecting the aluminum back contact of a silicon solar cell from oxidation, corrosion and electrolytic degradation during manufacture and subsequent use of the solar cell;

(2) in relation to a single fire process wherein the aluminum contact is formed y firing an aluminum paste, protecting the aluminum paste with a layer of an inert insulating paste so as to reduce the tendency of aluminum oxidation during the firing stage, and also provide a protective overcoating that protects the aluminum contact from oxidation, corrosion, and electrical degradation when exposed to varying climatic conditions;

(3) providing a method of making solar cells according to a single or double ire process that is characterized by the formation of a protective glass layer covering the aluminum back contact;

(4) providing an improved method of making solar cells wherein the rear surface o each solar cell is characterized by an aluminum contact and silver soldering pads, with the pads extending through openings in the aluminum contact and the aluminum contact nd silver soldering pad having an overlapping relation with one another at the edges of the pad;

(5) providing a solar cell having an aluminum rear contact and silver soldering pas extending through openings in the contact, with the aluminum contact overlapping the edges of the pas, and also a method of manufacturing same;

(6) providing an improved ingle fire process for forming contacts on a silicon solar blank having a preformed silicon nitride AR coating; and (7) providing a single-fir solar cell manufacturing method wherein the aluminum metallization that forms the rear contact contains a minimum of "bumps" resulting from oxidation during firing.

According to the preferred ode of practicing the invention, the foregoing and other objects o the invention are accomplished by providing a novel solar cell construction and method of manufacturing same, characterized in that the cell s manufactured using a solar cell blank that comprises a silicon semiconductor substrate having a shallow p-n junction adjacent its front surface, and an electrically insulating silicon nitride AR coating on its front surface. The blank is processed so as to provide it with (1) an aluminum rear electrical contact, (2) a low resistance, grid-like front electrical contact, and (3) a layer of an insulating material, preferably suitable glass, overlying the rear contact.

In one preferred embodiment based on the single fire concept, the solar cell has silver deposited onto two or more spaced areas of the ear surface of the solar cell blank so as to form to or more silver soldering pads, and an aluminum contact having apertures in registration with the silver deposits is ohmically bonded to the rear surface of the substrate with the apertures being sized so that the aluminum slightly overlaps the silver-coated areas. In an alternative embodiment formed by a double fire process, the silver soldering pads fill and also slightly overlap the aluminum contact at the periphery of the apertures. In both embodiments, a glass layer covers the aluminum contact and extends beyond the outer edges of that contact so as to totally seal the aluminum contact from the external atmosphere.

Although this invention contemplates the use of either a "double-fire" or a "single-fire" process for making solar cells, the "single-fire" process is preferred over the double fire process because it is simpler and hence less costly, and also because it tends to produce better efficiency cells. A "single-fire" process incorporating the present invention has been shown to result in higher $V_{oc}$ values and fill factors than the double-fire process. Hence, a "single fire" process utilizing the present invention offers the advantage of a cost reduction coupled with an improvement in solar cell performance and enhanced reliability.

With the foregoing in mind, it will be understood that in a broad sense, and subject to changes or additions as herein suggested, the preferred method of this invention generally include the following steps: (1) providing a solar cell blank comprising a semiconductor substrate having a shallow p-n junction adjacent its front surface and a layer of an AR material such as silicon nitride coating that front surface; (2) selectively coating the rear surface of the substrate with a metal past; (3) applying a layer of glass frit paste over the fist metal paste; (4) selectively coating the front surface of the AR layer with a second metal/glass frit paste so that the coating forms the desired pattern of a front contact; and (5) heating the substrate t a temperature and for for a time sufficient to (a) rapidly and efficiently cause the metal/glass frit past to penetrate the AR layer but not the p-junction nd have the metal content thereof form an ohmic contact on the front surface of the substrate, (b) cause the metal of the metal paste to alloy with the rear surface of the substrate so as to form a rear contact, and (c) cause the glass frit in the glass fri paste to melt and fuse so as to form a mechanically adherent coating that hermetically seals off the rear contact.

BRIEF DESCRIPTION OF THE DRAWINGS

Throughout the drawings, like reference numerals are utilized to identify like elements. It also should be understood that the drawings re intended to be illustrative only. The thicknesses and depth of the various layers, coatings and regions are neither shown to scale nor shown exactly in accordance with their relative proportions, for convenience and clarity of illustration. Similarly, cross-sectional vies are shown without cross-hatching for clarity.

Also, for convenience and clarity of description, the various layers of metal and lass pastes hat are applied to the solar cell blank are identified by the same reference numerals as the elements formed by firing those pastes.

DETAILED DESCRIPTION OF PREFERRED EMBODIMENTS

Figure 1:
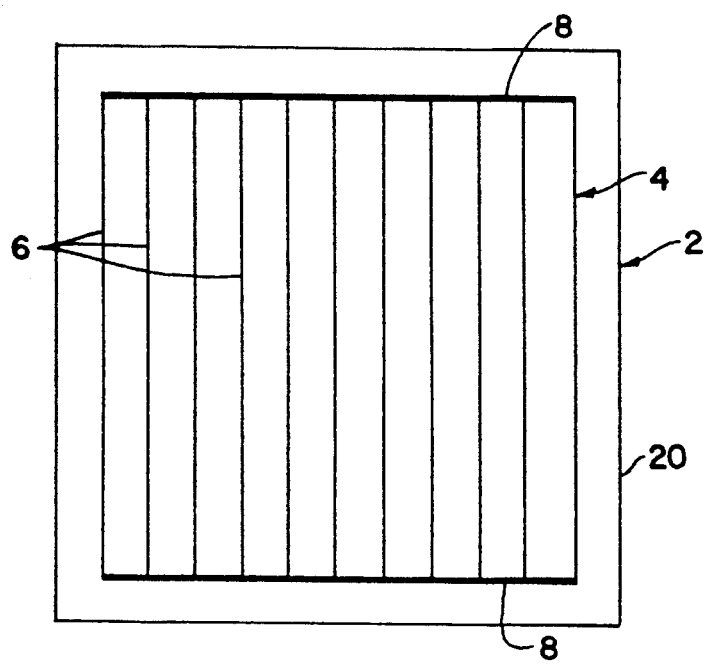
FIG. 1 is a top elevational plan view of an improved solar cell in accordance with this invention.
Figure 2:
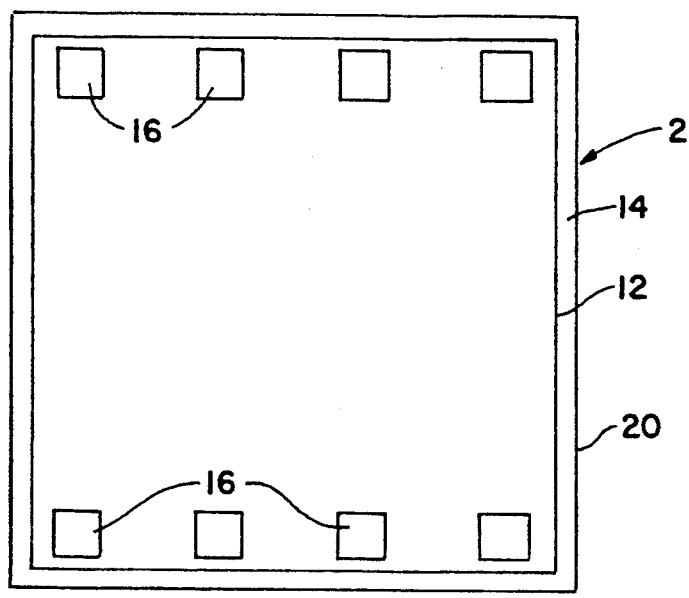
FIG. 2 is a bottom elevational plan view of the solar cell depicted in FIG. 1.
Figure 6:
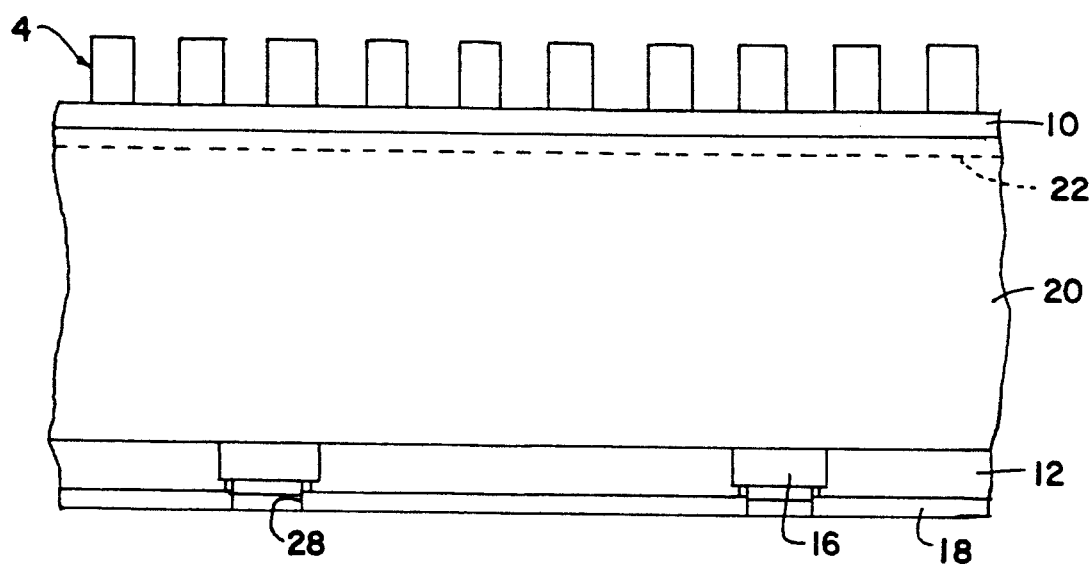
Figure 7:
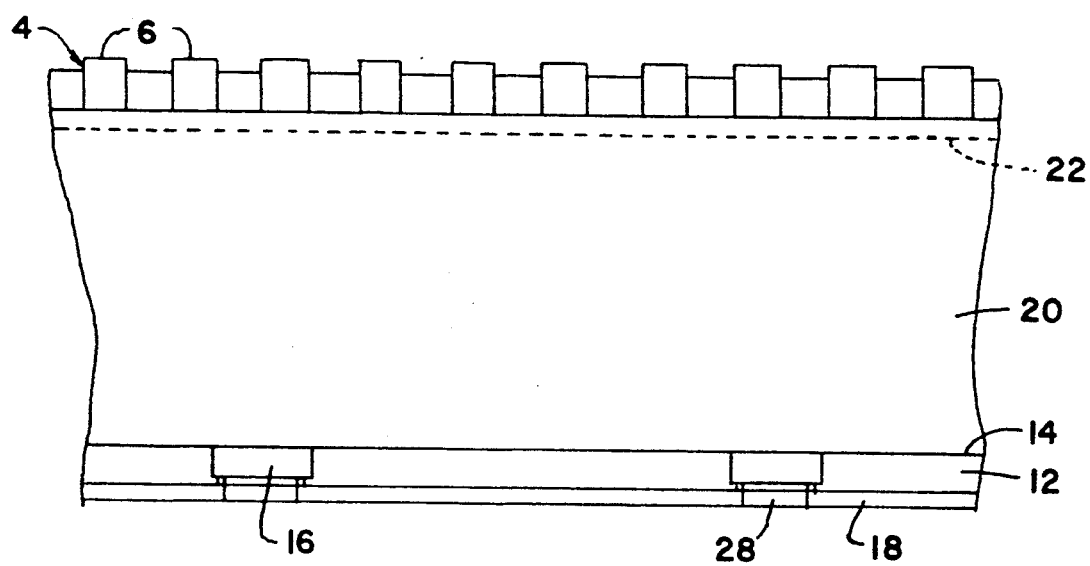

FIGS. 1, 2, and 7 illustrate he general nature of solar cells made according to the preferred single fire mode of practicing the invention. The cell 2 comprises a flat silicon EFG-grown substrate having on its front side a front contact 4 preferably in the form of a grid consisting of an array of narrow elongate, parallel fingers and at least one but preferably two bus bars 8 that interconnect fingers 6. Additionally, a tin AR coating 10 (see FIGS. 3 and 6) covers those portions of the front surface of the substrate that are not occupied by grid electrode 4. The rear side of cell 2 comprises a rear contact 12 (FIG. 2) that terminates short or the outer edges of the rectangular ell so as to have an uncoated margin portion 14 that extends along each side of the cell substrate, and also a plurality of soldering pads 16 hat extend through openings in the rear contact and are fused to the underlying solar cell substrate. Although FIG. 2 shows eight soldering pads arranged in two parallel, vertical rows (as viewed in FIG. 2), it is t be understood that the number of soldering pads and the number f rows of soldering pads may be varied.

Figure 4:
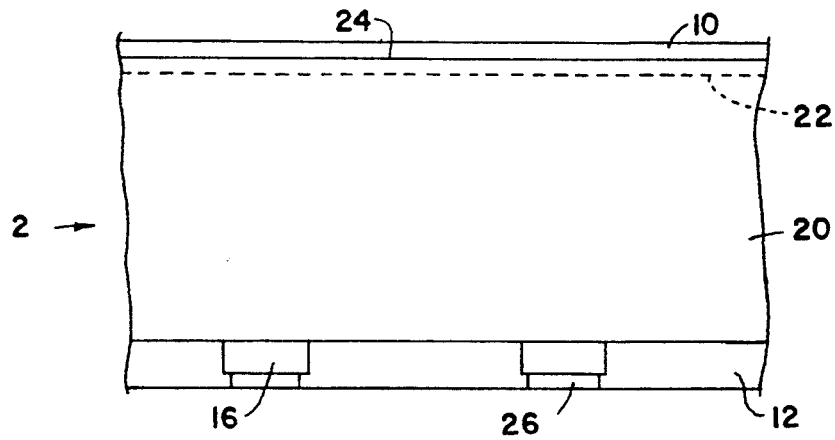
Figure 9:
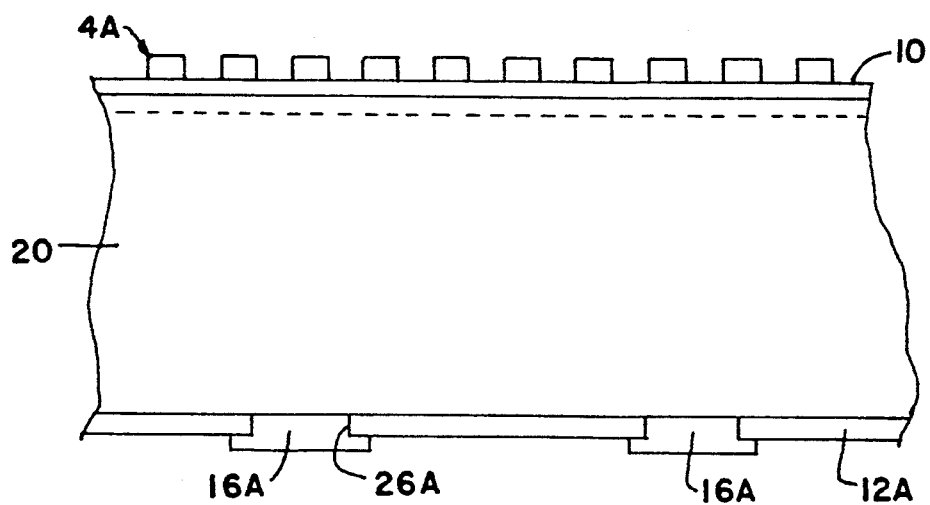
Figure 10:
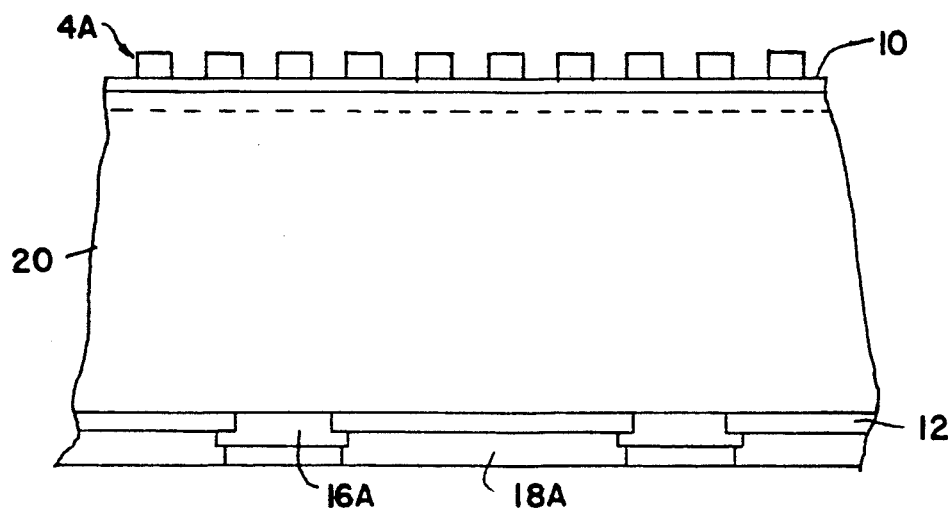
Figure 11:
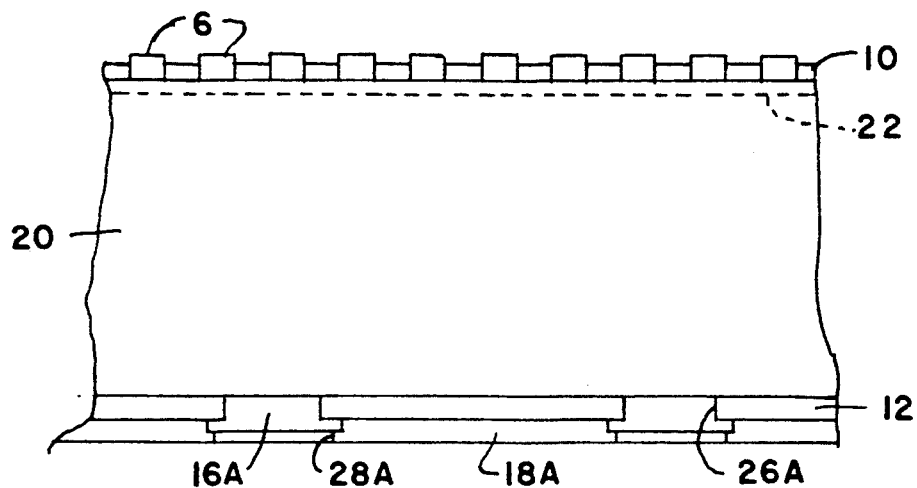

To the extent described in he foregoing paragraph, the solar cell structure shown iu FIGS. 1, 2, and 7 is old, as disclosed by PCT International Publication No. WO 92/0952, supra (U.S. Pat. No. 5,151,386, issued 29 Sep. 1992). In accordance with this invention, an insulating overcoating 18 (FIG. 7) covers he rear contact 12, edge portions of soldering tabs 15, and at least a portion of the margin area 14 of the rear surface that is not covered by the rear contact. Additionally, in the case of the single fire process, the soldering pads (silver) are formed before the rear contact (aluminum), with the later overlapping edge portions of the former, as shown in FIG. 4. In the case of the double fire process, the silver soldering pads preferably overlap adjacent portions of the rear aluminum contact, as shown in FIGS. 9-11. The reasons for this difference are two-fold. First, in the double fire process the rear aluminum contact is fired first and separately from the silver soldering pads in a nitrogen atmosphere. Second, it has been discovered that if the single fire process is practiced by applying first the aluminum paste and then the silver paste to form the rear contact and the soldering pads respectively, with the silver paste slightly overlapping the aluminum paste, the portion of the fired soldering pads that overlap the rear contact will tend to flake off and thus lower cell efficiency and reliability. It is believed that this flaking occurs because the organics in the paste used to form the rear contact are not fully driven off during firing in those areas where the silver metal soldering paste for forming the soldering pads overlies the aluminum metal paste.

Referring now to FIGS. 3-7, the preferred embodiment of this invention is a single fire process which commences with provision of a flat solar cell blank 2 comprising a flat silicon substrate 20. Preferably substrate 20 is rectangular and constitutes a p-type polycrystalline sheet grown by the EFG method which has been processed so as to have a shallow p-n junction 22 located adjacent its front surface 24, and a silicon nitride AR coating 10 covering front surface 24.

Preferably, the p-n junction is created by a suitable diffusion doping process according to well-known techniques, and the silicon nitride AR coating is formed using a suitable plasma deposition process as, for example, the one disclosed in International Patent Publication No. WO 89/00341, published 12 Jan. 1989, describing an invention of Chaudhuri et al. The teachings of that publication are incorporated herein by reference thereto.

Typically, substrate 20 has a thickness not exceeding about 0.016 inch. (e.g., a thickness in the range of 0.012 to 0.016 inch) and a resistivity of about 1-4 ohm-cm. The p-n junction 22 is located about 0.5 microns below the front surface of the substrate and the silicon nitride coating preferably has a thickness in the range of 600 to 1000 Angstroms, preferably about 800 Angstroms. The size of the solar cell blanks may vary, but the present invention is described hereinafter as applied to rectangular EFG solar cell blanks measuring approximately 4 inches×4 inches.

Figure 3:
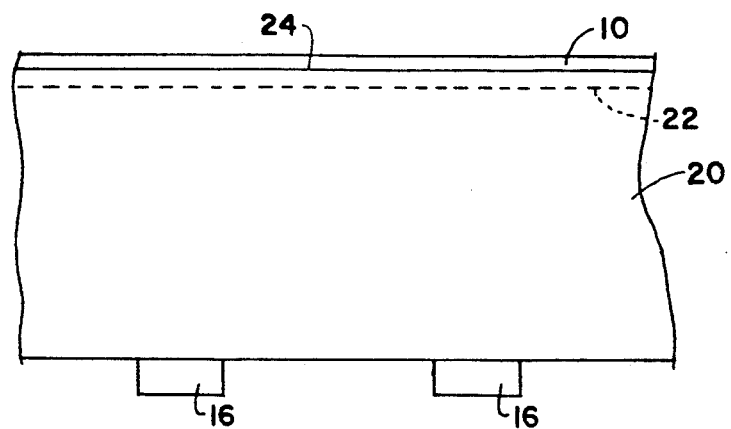
FIGS. 3-7 are diagrammatic cross-sectional views in side elevation illustrating steps of a single fire method constituting a preferred embodiment o the invention.

Referring now to FIG. 3, a silver metal/glass frit paste is applied to the rear side of the solar cell blank by a suitable technique, e.g., pad or silk screen printing, in the form of a plurality of rectangular soldering pad blocks 16. These blocks are then dried in air at a temperature and for a time sufficient to stabilize them so that they will not readily smear, e.g., by heating at 150 degrees C. for 2-4 minutes. The size of blocks 16 may vary. Preferably, for a solar cell blank measuring approximately 4"×4", the blocks 16 measure about 0.250"×0.250".

The silver metal/glass frit paste used to print the blocks 16 preferably comprises between 50 and 80 wt. % silver particles and 4-30 wt. % glass frit, with the remainder of the paste consisting of a vehicle comprising an organic binder such as ethyl cellulose or methyl cellulose and a solvent such as terpineol or Carbitol blended to provide the paste with a suitable viscosity, e.g., a paste viscosity in the range of 50 to 1000 poise at 25 degrees C. and a shear rate of $10s^{-1}$. Various commercially available silver pastes may be used to print blocks 16. Preferably, the silver metal paste for blocks 16 is based on DuPont's 4942 silver metal/glass frit paste modified with ESL Ni 2554 paste. The ESL paste is believed to contain about 40-70% nickel and it is mixed with the DuPont paste so that the resulting DuPont/ESL paste mixture is believed to be made up of approximately 70 wt. % silver, 1 wt. % nickel, 5 wt. % binder and 24 wt. % solvent. In the case where blocks 16 are formed by pad printing, this DuPont/ESL paste mixture is diluted by adding 10–25 wt. % of Carbitol. The resulting paste is pad printed in a thickness so as to provide each block 16 with a silver content of 18 mg per cm$^2$ of coated substrate surface.

Next, as shown in FIG. 4, an aluminum paste 12 is applied to the rear surface of the solar cell blank so as to slightly overlap the dried silver paste soldering pad blocks 16 and leave the uncoated margin portion 14 (FIG. 2). Preferably, the aluminum paste is applied so as to leave rectangular windows 26 that frame and slightly overlap the silver paste blocks 16. Preferably, but not necessarily, windows 26 measure about 0.180 inch on each side, whereby the aluminum paste overlaps each side edge of the silver paste blocks by about 0.035 inch. Preferably, but not necessarily, the aluminum paste is applied so that the uncoated margin portion 14 of the rear side of the substrate has a uniform width of about 0.040". This aluminum layer is then dried in air, preferably at about 150 degrees C. for 2–4 minutes.

As mentioned hereinabove, a "thick" aluminum contact is feasible using the single fire process but not the double fire process. Accordingly, the single fire process offers the option that the paste 12 may be applied in amounts adequate to form a "thin" or "thick" aluminum contact as desired. Because of an improvement in cell output, it is preferred to apply paste 12 in an amount adequate to form a "thick" aluminum rear contact, preferably with a paste applied so as to provide an aluminum content in the range of 4.5 to 8 mg/cm$^2$, with the result that firing will result in an aluminum metal contact having a thickness of about 20–30 microns and a P+ region in the substrate having a depth of 5 to 8 microns. For silicon substrates having a thickness of about 12 mils, it is preferred to have aluminum contacts that are about 20 microns thick and have a P+ region about 5 microns deep. For silicon substrates that are about 16 mils thick, it is preferred to have contacts that are 30 microns thick and a P+ region that is about 8 microns deep.

The aluminum paste preferably comprises between about 50 and 70 wt. % aluminum particles, with the remainder of the paste being a vehicle comprising an organic binder such as ethyl cellulose or methyl cellulose and a solvent such as Carbitol or terpineol blended to provide the paste with a viscosity suitable for printing the paste onto the solar cell blank. A suitable aluminum paste may be provided using commercially available inks. By way of example, a suitable paste is achieved by diluting Ferro FX53-015 aluminum paste with between 10–25 wt. % of a solvent such as Carbitol or terpineol.

Figure 5:
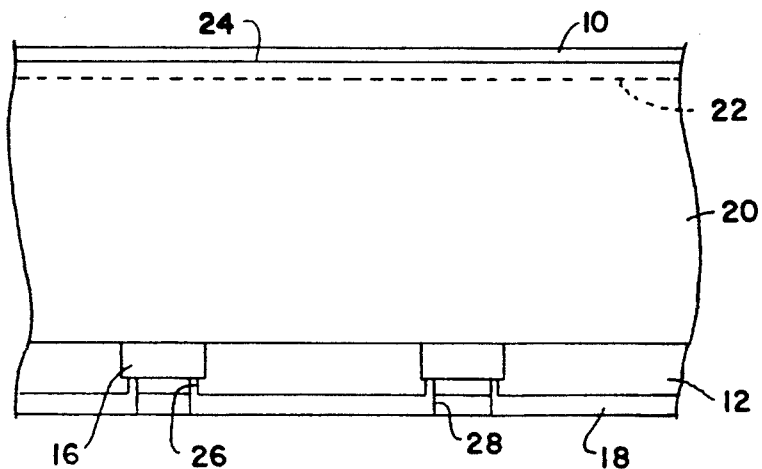

Then, as shown in FIG. 5, a coating of a glass frit paste 18 is applied over the dried aluminum paste so as to leave apertures or windows 28 that are slightly smaller than the windows 26 formed by the dried aluminum paste, with the result that the glass frit paste overlaps marginal portions of the dried silver paste blocks 16. Windows 28 are smaller than windows 26, preferably measuring about 0.150"×0.150" so that at each window 28 the glass frit paste extends beyond the aluminum layer and overlaps the silver paste blocks 16 by about 0.030" at each side. Although not shown, it is to be understood that glass paste 18 extends beyond the outer boundary of aluminum metal paste layer 12, preferably but not necessarily to the periphery of the rear surface of the solar cell blank. The glass frit paste is applied in an amount such that after firing the glass overcoating 18 has a thickness of about 4 microns. The glass paste 18 is then dried, preferably in air at about 150 degrees C. for 1–4 minutes.

The glass frit paste is preferably a commercially available product diluted to provide the desired flow characteristics. By way of example, the glass frit content may be a zinc or lead borosilicate, with the zinc-type glass being preferred because of government restrictions on use and disposal of lead-containing materials.

Lead and zinc borosilicate glass frits and glass frit pastes are preferred in the present context for numerous reasons. First, the glass frits are readily available and may be mixed into pastes which can be applied by conventional thick film methods such as silk screening, pad printing, and direct writing techniques. Second, pastes incorporating lead borosilicate frits are readily available. One such paste is manufactured by Ferro Company of Santa Barbara, Calif. and identified by the product code 1149. Although the specific composition of the Ferro 1149 product is proprietary, it is believed that that product contains about 60–70% lead borosilicate particles, 10% organic binder and 20–30% solvent. Further, after suitable viscosity modification, for example, by dilution with 10–25 wt. percent Ferro solvent #800, a film of this material may be deposited onto the substrate, preferably by pad printing, which subjects the semi-conductor substrate to smaller stresses and thereby reduces breakage problems. A suitable and preferred glass frit paste can be made by mixing zinc borosilicate glass frit product #7574 of Corning Glass, of Corning, N.Y. with 3.5 wt. % ethyl or methyl cellulose as a binder and 42.5 wt. % of terpineol or Carbitol as a volatile solvent. The softening points of the above-mentioned borosilicate glasses are compatible with the times and temperatures required for firing aluminum metal and silver metal pastes in the formation of solar cell contacts. These glasses also bond well with aluminum surfaces, are stable chemically in the presence of moisture, and do not chemically react with aluminum, silver or silicon. Also, they are corrosion resistant.

Then a silver/glass frit paste is applied to the silicon nitride layer 10 in a suitable grid-defining pattern, e.g., the pattern 4 shown in FIG. 1. This may be done in various ways, e.g., screen printing or direct writing using a Micropen direct writing machine. As seen in FIG. 6, paste 4 is applied as a coating that is relatively thick in relation to the AR coating 10. Preferably, it is applied so as to have a thickness in the range of 20 to 50 microns after firing, with the ratio of silver content of the paste to coated substrate surface being in the order of 10 mg./cm$^2$. This silver/glass frit paste is then dried in air to remove volatile solvents, preferably by heating at about 150 degrees C. for 1–4 minutes.

Various silver metal/glass frit pastes may be used to form the grid electrode. Suitable pastes consist of between 50 and 80 wt. % metal particles, 4 to 30 wt. % glass frit, and 10–25 wt. % organic compounds (i.e., the binders and solvents constituting the organic vehicle). Preferably, the silver metal/glass frit pastes used for the grid contact comprise a lead borosilicate glass frit, although zinc borosilicate glass frit also may be used. Commercially available silver/glass frit pastes and inks may be used. By way of example, the paste for forming the grid electrode may consist of Ferro 3349 paste. The Ferro paste as purchased is believed to comprise about 50–75 wt. % silver and about 10 wt. % glass frit. This paste may be diluted with Carbitol or terpineol to provide the flow characteristics required for the particular method used to print the grid electrode pattern.

Thereafter, the coated solar blank is fired in an oxygen containing atmosphere, preferably in a radiant heated belt-type furnace having a maximum temperature in the range of 800–900 degrees C. The firing is conducted so that the substrate reaches a peak temperature of 780–810 degrees C., preferably a peak temperature of 790–800 degrees C., for a period of time sufficient to (1) remove all volatile and pyrolizable organic constituents from the pastes, (2) convert the silver paste blocks into silver soldering pads that make an ohmic contact with substrate 20, (3) cause the aluminum metal particles to alloy with the substrate and bond to the silver soldering pads 16, (4) convert the glass frit paste into a solid adherent glass overcoat 18, (5) cause the silver metal/glass frit paste to fire through the silicon nitride layer and form a silver contact bonded to the upper surface of the substrate, and (6) optimize the properties of the solar cell, i.e., cell efficiency, fill factor, and expected useful life. The grid contact 4 that is formed by the firing has a thickness such that it projects above the silicon nitride layer so that connecting a conductive ribbon to the grid contact is easily accomplished. Preferably, the actual time the substrate is held at its peak temperature of 780–810 degrees C. is between 1 and 6 seconds, with the substrate being at a temperature of 700 degrees C. or higher for between about 5 and about 20 seconds. However, the total time that the cell remains in the furnace may vary, e.g., from about 2 to 10 minutes depending upon the "ramp-up" and "ramp-down" times, i.e., the time required to (a) heat the substrate up to the firing temperature and (b) cool the substrate down from the firing temperature to a temperature near room temperature where it can be handled for subsequent cooling to room temperature and/or storage or other subsequent manufacturing operations.

Solar cells made according to the foregoing single fire method using EFG grown silicon substrates typically exhibit fill factors in the range of 0.72 to 0.79 and efficiencies in the range of 12.5 to 14%, and also offer the advantage that they resist degradation under high temperature, high humidity conditions for times 50% or more greater than cells made without the glass overcoating, and also the breakage of substrates during the time that the pastes are being converted to contacts and soldering pads is drastically reduced (this latter advantage is particularly significant when "thick" aluminum rear contacts are being formed).

As alluded to above, the glass overcoating provided according to this invention may be used in the course of manufacture of solar cells by a double fired process for the purpose of improving the corrosion resistance of the back contact. With the double fire process, the rear surface of the substrate 20 is coated with an aluminum metal paste (with or without windows for provision of silver soldering pads), and then the aluminum paste is fired in a nitrogen atmosphere to form the rear contact. Then if no soldering pads 16 are to be provided, a glass frit paste is applied as a covering layer for the final aluminum paste, and then dried. Thereafter, a silver/glass frit paste is coated onto the AR layer in a selected grid electrode pattern, and fired in air to form the front grid contact.

However, if the back contact is formed with apertures to accommodate silver soldering pads, following the drying of the aluminum paste and before application of the glass frit paste, a silver metal/glass frit paste is printed into the apertures of the aluminum metal paste and then dried, to provide silver paste blocks 16A which form the basis of the soldering pads, and preferably this is done prior to coating the silver/glass frit paste onto the AR coating. This added silver metal/glass frit paste that forms pads 16 is fired simultaneously with the silver/glass frit paste that forms the grid electrode.

Figure 8:
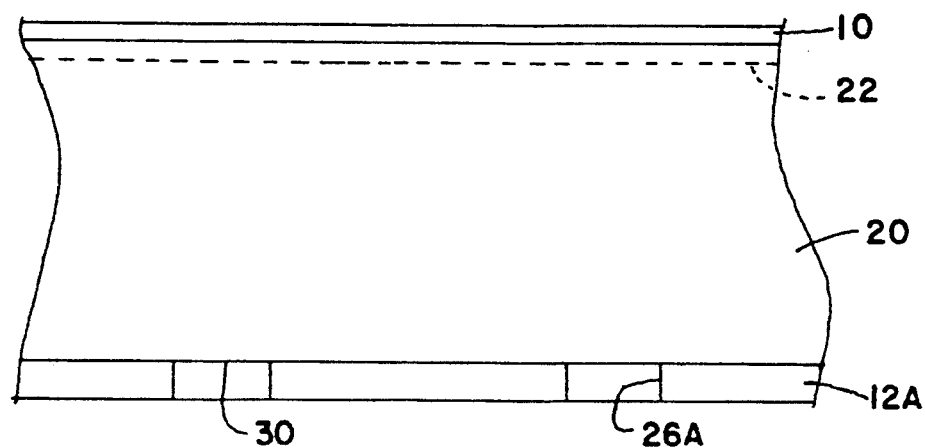
FIGS. 8-11 are diagrammatic cross-sectional views in side elevation similar to FIGS. 3 to 7 illustrating steps of a double fire process constituting a second embodiment of the invention.

The preferred method of practicing the double fire method is illustrated in FIGS. 8–11. As seen in FIG. 8, a coating of an aluminum metal paste 12A is applied to the rear surface of the substrate 20, with the coating of aluminum paste terminating short of the edges of the substrate so as to provide an uncoated marginal portion as shown at 14 in FIG. 1, and also providing apertures 26A that expose limited mutually spaced areas 30 of the rear surface of substrate 20. Unfortunately, fabrication of a "thick" aluminum back contact is not feasible using the double fire process due to warping and ultimate fracture of the solar cell blanks because of stresses and other factors, as mentioned hereinabove. Then the aluminum paste is fired in nitrogen at a temperature in the range of 700 to 850 degrees F. for a period of about 0.25 to 4 minutes.

Then, as shown in FIG. 9, a silver metal paste is applied to the rear surface of the substrate through the apertures 26A so as to form printed blocks 16A that slightly overlap the layer of dried aluminum paste 12A. Also, as shown in FIG. 9, a silver metal/glass frit paste 4A is applied over the silicon substrate AR coating 10 in the desired grid contact pattern. Then preferably, but not necessarily, printed silver metal paste blocks 16A and the printed silver metal/glass frit layer 4A are dried as previously described.

The relative order in which the silver metal/glass frit paste and the silver metal pastes are applied to the front and rear surfaces of the substrate is not critical with either the single or double fire process, although in both cases it is preferred to apply the silver metal paste to the rear side of the substrate before the silver metal/glass frit paste is coated onto the AR layer. In either case, it is preferred that both silver-containing pastes be dried using the drying conditions previously described herein.

Thereafter a glass frit paste 18A as above described is coated onto the rear side of the substrate as shown in FIG. 10 so as to partially overlap the silver paste blocks 16A at windows 28A.

Then the substrate is fired according to the conditions previously described to form the soldering pads and the front contact and also form a glass overcoating for the rear contact.

In the double fire process the aluminum metal paste is applied in a thickness providing an aluminum metal content in the order of 1.5 mg. of aluminum per cm$^2$ of aluminum-coated substrate.

The invention will be better understood by reference to the following examples.

EXAMPLE I (Single Fire Process)

Referring to FIGS. 3–7, a 4"×4" p-type, EFG grown silicon substrate 20 is provided having a conductivity of about 1–4 ohm-cm, a thickness of about 0.016 inch, a shallow p-n junction 22 formed about 0.5 microns from the front surface of the substrate by phosphorus spray diffusion or some other suitable diffusion process, and a silicon nitride AR coating 10 about 800 angstroms thick covering the front surface of the substrate 4, with the AR coating being formed according to the method described in U.S. Pat. No. 4,751,191, supra.

Eight (8) mutually spaced small areas (each approximately 0.250 inches × 0.250 inches) of the rear surface of the substrate then are covered uniformly with a layer of a silver metal paste made by diluting DuPont 4942 silver metal paste with ESL #2554 nickel paste and about 10–25 wt. % Carbitol so as to form printed silver paste blocks 16. This is accomplished using a pad printing technique, with the paste being applied in a thickness such that for each printed layer 16 the weight of silver per unit area of the coated surface of the substrate is approximately 18 mg/cm$^2$. Paste blocks 16 are subsequently dried at 150° C. in air for 2–4 minutes (see FIG. 3).

Thereafter, an area of the rear side of the substrate is coated with a layer of an aluminum paste consisting of Ferro FX53-015 aluminum metal ink diluted by adding between about 10–25 wt. % of Carbitol, with the aluminum metal paste being applied centrally on the rear surface of the substrate 4 by a pad printing technique so as to leave an uncoated band or margin area 14 measuring about 0.040 inches wide. The aluminum metal paste also is printed so as to provide windows 26 as previously described that are sized so as to overlap the side edges of the silver metal paste blocks 16 by about 0.030". The aluminum paste is applied so as to provide an aluminum content in metal paste layer 12 of about 8 mg/cm$^2$. The aluminum layer 12 is then dried at 150 degrees C. for 2–4 minutes in air (see FIG. 4).

Thereafter, a layer 18 of a zinc-containing borosilicate glass frit paste comprising Corning 7574 glass frit is pad printed over the dried aluminum paste 12 and the margin area 14 with a thickness such as to provide a glass layer about 4 microns thick after firing. The weight of the glass frit in layer 18 totals about 1.5 mg/cm$^2$. The glass paste layer 18 extends to the edges of the substrate and includes eight rectangular apertures 28 aligned with silver metal paste blocks 16 that are sized so as to permit the glass frit paste to overlap the edges of windows 26 in the aluminum paste layer 12 by approximately 0.015 inches (i.e., each window 28 measures approximately 0.150 × 0.150 inches). The glass frit paste layer 18 is then dried at 150 degrees C. for 1–4 minutes.

Then a silver metal/glass frit paste is printed onto the silicon nitride coating 10 in a grid contact pattern as shown in FIG. 1. The paste comprises Ferro silver/glass frit paste #3349. The silver/glass frit coating is applied so as to provide (1) a silver content of about 10 mg/cm$^2$ of a silver coated area of the substrate, and (2) a grid contact having a thickness (height) in the order of 30 microns after the cell has been fired.

Thereafter, the silicon blank is fired in an oxygen-containing atmosphere in a radiant-heated belt furnace for a period such that the substrate reaches a peak temperature of about 790 degrees C. and is held at that peak temperature for between about 1 and 6 seconds. The exit zone of the furnace has a temperature of about 100–125 degrees C., and the conveyor belt is moved at a speed whereby each substrate is in the furnace for 2–10 minutes, long enough to ramp the substrate up to its peak temperature and ramp it back down to about 70 degrees C. as it leaves the furnace.

The resulting cell has an aluminum contact measuring about 30 microns thick, with a P+ layer in the substrate at the aluminum/silicon interface that is about 8 microns deep. Cells made according to this example typically have efficiencies of 12.5–14% and fill factors of 0.72–0.79, and also have superior resistance to corrosion.

The following example illustrates a double-fire method incorporating the invention.

EXAMPLE II (Double Fire Process)

A solar cell blank of the type described in Example I is provided. An aluminum metal paste the same as that used in Example I is applied to the rear side of substrate 20 as a layer 12A having eight rectangular apertures 26A measuring approximately 0.170 × 0.170 and leaving an uncoated margin area s shown at 14 in FIG. 1 measuring about 0.040" wide. The paste is applied with a thickness that provides approximately 1.5 mg/cm$^2$ of aluminum metal particles on the surface area of the substrate covered by the paste. The blank is then fired in a furnace in a nitrogen atmosphere, with the blank being heated to a peak temperature of 820 degrees C., and held at that temperature for about 0.25 minutes.

After the aluminum metal paste has been fired, a silver metal/glass frit paste comprising a mixture of DuPont 4942 silver paste and ESL 2554 Ni paste, diluted by 10–25% Carbitol, is applied to the rear side of the substrate in the openings 26A so as to form silver metal paste blocks 16A, with the silver metal paste overlapping the fired aluminum contact at the filled openings 26A by about 0.40 inch at each side of those openings. The silver paste blocks 16A are dried in air at 150 degrees C. for 2–4 minutes. The DuPont/ESL paste mixture is the same as the one described in Example I, but the paste is applied so as to provide about 2.0 mg of aluminum for each cm$^2$ of the substrate that is coated with that paste.

Next, a glass frit paste is printed over the aluminum contact, with the glass frit paste comprising about 55 wt. % zinc borosilicate glass frit and 45 wt. % organic vehicle so as to provide a glass frit content of about 1.5 mg/cm$^2$ of coated surface. This glass frit paste is then dried in air at about 150 degrees C. for about 1–4 minutes.

Then a silver metal/glass frit paste is printed onto the silver nitride AR layer using the same paste and procedure used in Example I. As the next step, this silver paste layer 4A (FIG. 10) may be dried in air at 150 degrees C. for about 1–4 minutes. However, this drying step may be omitted in preference for firing the substrate without any intermediate drying step.

Thereafter, the blank is fired according to the firing procedure described in Example I.

Cells made according to the double fire method exhibit cell efficiency and fill factor values comparable to, but slightly less than those made by the single fire method. Cells made by the double fire method show the same improved resistance to corrosion as the ones made by the single fire method.

Figure 12:
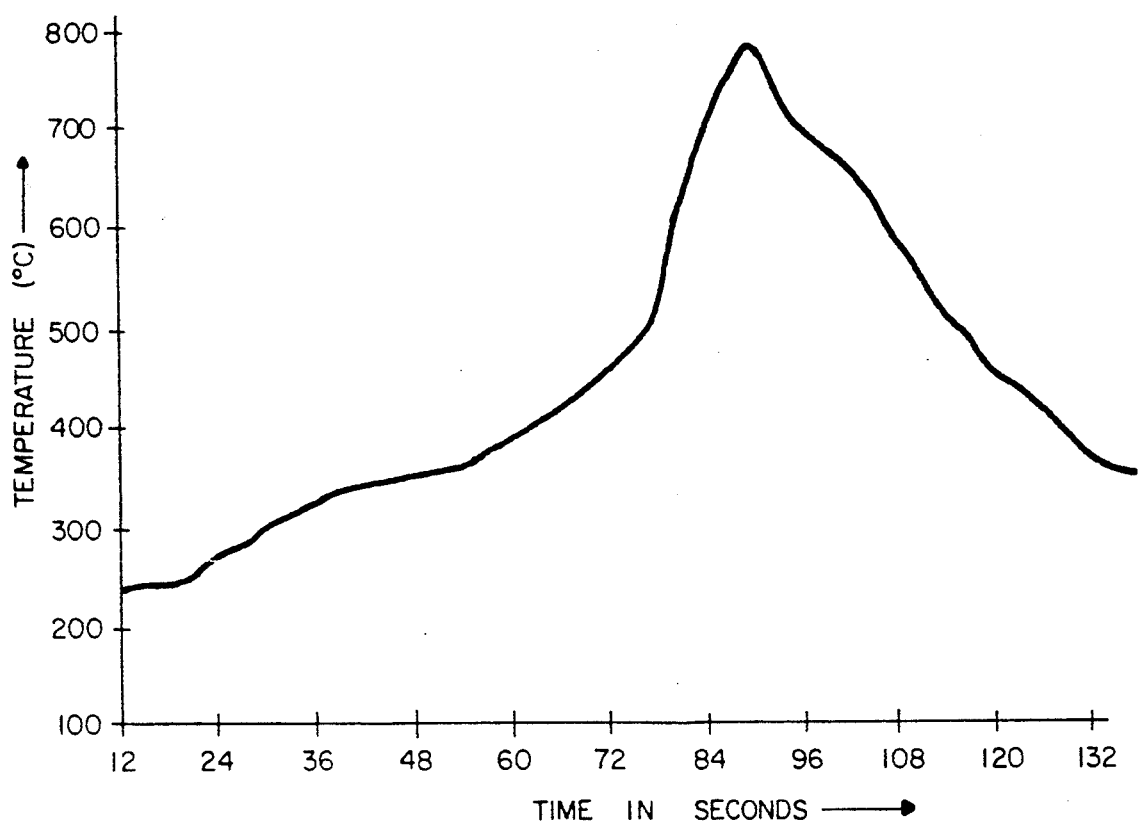
FIG. 12 is a graphical representation of the temperature profile of a silicon substrate a it undergoes firing of its silver front contact in accordance with the single fire or double fire embodiments of the invention.

FIG. 12 pertains to both the single fire and double fire embodiments of the invention and graphically illustrates the change in temperature of the substrate as it is fired to cause the silver/glass frit paste applied to the silicon nitride AR coating to form a front contact. As can be seen from FIG. 12, the substrate undergoes a rapid increase in temperature up to about 790 degrees C., and then its temperature is decreased rapidly as it passes through a cooling zone in the furnace. The substrate should be maintained at a temperature of 700 degrees C. or higher for a period of 5-20 seconds. Preferably, as shown in FIG. 12, the substrate is held at a temperature of 700 degrees C. or higher for about 12 seconds.

The benefits of the construction of this invention are numerous. The glass layer effectively precludes corrosion of the aluminum rear contact during use. Accordingly, the criticality of the need to encapsulate a module comprising a plurality of solar cells is reduced. Also the glass layer is a good dielectric, and serves as an electrically insulating layer. This is especially important if, for example, it is desired to form a wrap-around front contact.

Devices made in accordance with the teachings of this invention display significantly longer life expectancies in conventional accelerated (high temperature, high humidity) test conditions than unprotected solar cells, primarily due to prevention or reduction of oxidation of the rear aluminum contact during firing and also during use, as a consequence of the protection afforded by the protective glass layer. The single fire process of this invention avoids the creation of "bumps" in the rear contact during firing. Further, a single fire process as herein described permits the rear electrode to be made substantially thicker than conventional aluminum rear electrodes. The invention also offers the advantage that it is possible to consistently produce solar cells using polycrystalline sheets as substrates that have average efficiencies of 12.5 to 14.0% and fill factors in the range of 0.72 to 0.79, with the double fire process producing cells that tend to have lower efficiencies than those produced by the single cell process.

Persons skilled in the art will recognize that the invention may be subject to certain modifications, changes, variations and the like that are or will be obvious to those skilled in the art in view of the foregoing detailed description. Thus, it is not necessary to use EFG substrates to achieve the foregoing results. Single crystal substrates and polyethylene substrates produced by other methods also may be used. Also, for example, the rear side of the solar cell need not have separate soldering pads as shown at 16, and instead the aluminum back contact may be substantially uninterrupted over its length and breadth. Accordingly, it should be understood that the foregoing specification is intended to be illustrative but not limiting of the invention in its broadest aspects. The invention, therefore, should be understood as being limited only by the terms of the appended claims.

What is claimed is:

1. A photovoltaic cell comprising:
   a silicon semiconductor substrate having a front surface, a rear surface, and a shallow p-n junction adjacent said front surface;
   a first conductive metal layer in mechanically adherent and electrical contact with said rear surface, said first metal layer essentially comprising aluminum;
   a second conductive metal layer in adherent and electrical contact with said front surface, said second conductive metal layer defining a predetermined grid electrode pattern;
   a radiation-transparent AR coating covering at least that portion of said front surface of said substrate not covered by said second conductive metal layer; and
   a protective coating covering and sealing said first conductive metal layer, said protective coating being a glass selected from the group consisting of a lead-containing borosilicate glass, a zinc-containing borosilicate glass, and mixtures of said zinc-containing borosilicate glass and said lead-containing borosilicate glass.

2. The photovoltaic cell of claim 1 wherein said AR coating comprises silicon nitride.

3. The photovoltaic cell of claim 2 wherein said AR coating is approximately 800 Angstroms thick.

4. The photovoltaic cell of claim 1 wherein said first metal layer comprises aluminum metal in a concentration corresponding to an aluminum weight of between about 400-700 mg per a 3.781×3.781 inch area.

5. The photovoltaic cell of claim 4 wherein said first metal layer is between about 20 and 30 microns thick.

6. The photovoltaic cell of claim 1 wherein said second metal layer comprises silver metal and an inorganic glass frit.

7. The photovoltaic cell of claim 1 wherein said second metal layer has a thickness greater than the thickness of said anti-reflection coating.

8. The photovoltaic cell of claim 1 wherein said glass is a lead borosilicate glass.

9. The photovoltaic cell of claim 1 wherein said glass is a zinc borosilicate glass.

10. The photovoltaic cell of claim 1 wherein said glass has a thickness of approximately 4 microns.

11. The photovoltaic cell of claim 1 wherein said glass will soften and flow at a temperature of between about 760° C.-800° C.

12. A method for making a photovoltaic cell having an improved useful lifetime, said method comprising the steps of:
   (a) providing a solar cell blank comprising a semiconductor substrate having a front surface, a rear surface, a shallow p-n junction adjacent said front surface, and an AR coating covering said front surface;
   (b) applying a layer of a metal paste to said rear surface of said substrate so as to substantially cover a substantial portion of same;
   (c) applying a layer of an inorganic glass frit paste over the metal paste applied to said rear surface in step (b);
   (d) applying a metal/glass frit paste onto said AR coating in a predetermined electrode pattern; and
   (e) firing said blank in an oxygen-containing atmosphere at a temperature and for a time such that (1) said metal/glass frit paste penetrates through said AR coating and the metal content of said metal/glass frit paste forms a mechanically adherent and electrical contact with said front surface of said substrate, (2) the metal content of the metal paste applied in step (b) forms a mechanically adherent and electrical metal contact with said rear surface of said substrate, and (3) the glass frit in said glass frit paste fuses so as to form an adherent protective glass layer encasing the metal contact formed on said rear surface of said substrate.

13. The method of claim 12 wherein said semiconductor substrate is made of silicon, the metal paste used in step (b) is an aluminum metal paste, and said metal/glass frit paste is a silver/glass frit paste.

14. The method of claim 13 wherein said AR layer comprises silicon nitride and is approximately 800 Angstroms thick.

15. The method of claim 13 wherein the layer of glass frit paste is approximately 10 microns thick prior to step (e).

16. The method of claim 13 wherein the glass frit in said metal/glass frit paste is selected from the group consisting of a lead-containing borosilicate glass, a zinc-containing borosilicate glass, and mixtures of said lead-containing borosilicate glass and said zinc-containing borosilicate glass.

17. The method of claim 13 wherein the metal paste in step (b) is applied by a pad printing technique.

18. The method of claim 13 wherein said firing step (e) is performed in air.

19. The method of claim 18 wherein said substrate is fired by heating it to a peak temperature between 780 degrees C. and 810 degrees C., with a temperature above 700 degrees C. for a time not exceeding 20 seconds.

20. The method of claim 12 wherein the glass frit content of said glass frit paste comprises a lead-containing borosilicate glass, a zinc-containing borosilicate glass, or a mixture thereof.

21. The method of claim 12 wherein said substrate is fired by heating it to a peak temperature of 780–810 degrees C. for only 1–6 seconds.

22. The method of claim 12 wherein the paste applied in step (b) is dried before step (c).

23. The method of claim 12 wherein the paste applied in step (c) is dried before step (d).

24. The method of claim 12 wherein the paste applied in step (b) is dried before step (c), and the paste applied in step (c) is dried before step (d).

25. The method of claim 24 wherein said drying steps are performed in air at approximately 150 degrees C.

26. The method of claim 12 wherein in step (b) said metal paste is applied so as to form a layer having at least two or more apertures each exposing a selected portion of said rear surface of said substrate, and further wherein after step (b) but before step (c) a second metal paste is applied so as to cover those selected exposed portions of said rear surface, and further wherein said glass frit paste is applied so as to form openings aligned with said apertures but sized so that said glass frit paste overlaps said first-mentioned metal paste at said apertures.

27. The method of claim 12 wherein said substrate is between about 12 and 16 mils thick.

28. The method of claim 12 wherein prior to step (b) another metal paste comprising a solderable metal is applied to said rear surface such that a plurality of discrete areas of said rear surface are formed with blocks of said another metal paste, and said first-mentioned metal paste is applied so as to form a metal paste layer having at least two or more apertures each exposing a selected portion of one of said blocks, but with said metal paste layer overlapping edge portions of said blocks, and further wherein said glass frit paste is applied so as to form openings aligned with said apertures but sized so that said glass frit paste overlaps said first-mentioned metal paste at said apertures.

29. The method of claim 28 wherein said another metal paste is a silver metal paste and said first-mentioned paste is an aluminum metal paste.

30. The method of claim 12 wherein said substrate is fired in step (d) so that it undergoes a change in temperature substantially as illustrated in FIG. 12.

31. A method for making a photovoltaic cell having an improved useful lifetime, said method comprising the steps of:
(a) providing a solar cell blank comprising a semiconductor substrate having a front surface, a rear surface, a shallow p-n junction adjacent said front surface, and an AR coating covering said front surface;
(b) applying a layer of a first metal paste to said rear surface of said substrate so as to cover selected first area portions of said rear surface;
(c) applying a layer of a second metal paste to said rear surface of said substrate so as to cover second area portions thereof that are not covered by said first metal paste, with said second metal paste layer overlapping portions of said first metal paste layer;
(d) applying a layer of an inorganic glass frit paste over the layer of said second metal paste applied to said rear surface in step (c);
(e) applying a metal/inorganic glass frit paste onto said AR coating in a predetermined electrode pattern; and
(f) firing said blank in an oxygen-containing atmosphere at a temperature and for a time such that (1) said metal/glass frit paste penetrates through said AR coating sufficiently for the metal content of said metal/glass frit paste to form a low electrical resistance contact bonded to said front surface, (2) the metal content of the metal paste applied in step (b) forms a mechanically adherent metal layer that forms an ohmic bond with said rear surface at each of said first area portions thereof, (3) the metal content of the second metal paste applied in step (c) is alloyed to said substrate so as to form an ohmic rear contact with said second area portions of said rear surface, and (4) the glass frit in said glass frit paste fuses so as to form an adherent continuous glass layer encasing said rear contact.

32. The method of claim 31 wherein said glass frit paste is approximately 10 microns thick prior to firing.

33. The method of claim 31 wherein the glass frit in said metal/glass frit paste is a lead-containing borosilicate glass.

34. The method of claim 31 wherein the glass frit in said glass frit paste is selected from the group consisting of lead containing borosilicate glass, zinc containing borosilicate glass, and mixtures of lead containing borosilicate glass and zinc containing borosilicate glass.

35. The method of claim 31 wherein said first and second metal pastes are applied to said solar cell blank by pad printing, and said metal/glass frit paste is applied so said solar cell blank by a direct writing technique.

36. The method of claim 31 wherein said substrate is silicon, and said firing step is performed in an oxygen containing atmosphere.

37. A photovoltaic cell comprising:
a silicon semiconductor substrate having a front surface, a rear surface, and a shallow p-n junction adjacent said front surface;
a first electrically conductive metal layer in mechanically adherent and electrical contact with said rear surface, said layer consisting essentially of aluminum and including two or more openings therethrough at selected locations on said rear surface of said substrate;

an electrically conductive metal soldering pad disposed in each of said openings, each of said soldering pads having a peripheral portion in electrical contact with said first conductive layer and a surface in mechanically adherent and electrical contact with said rear surface;

a second electrically conductive metal layer in adherent and electrical contact with said front surface, said second metal layer defining a predetermined grid electrode pattern;

a radiation-transparent AR coating covering at least that portion of said front surface of said substrate not covered by said second metal layer; and a protective coating of an electrically-insulative, corrosion-resistant inorganic material covering and sealing said first metal layer, said protective coating defining two or more apertures therethrough in registration with said two or more openings, said apertures being smaller than said openings but large enough to leave at least the central regions of said soldering pads exposed for connection to outside circuit elements.

38. The photovoltaic cell of claim 37 wherein said soldering tabs fully fill said openings in said first metal layer.

39. The photovoltaic cell of claim 38 wherein said apertures are sized so that said protective coating overlaps edge portions of said soldering tabs.

40. The photovoltaic cell of claim 37 wherein said soldering tabs essentially comprise silver metal.

41. The photovoltaic cell of claim 37 wherein said second metal layer essentially comprises silver metal and said AR coating is silicon nitride.

42. The photovoltaic cell of claim 41 wherein said soldering tabs essentially comprise silver metal.

43. The photovoltaic cell of claim 37 wherein said protective coating consists of a glass from the group consisting of lead containing borosilicate glass, zinc containing borosilicate glass, and mixtures of lead containing borosilicate glass and zinc containing borosilicate glass.

* * * * *

UNITED STATES PATENT AND TRADEMARK OFFICE
CERTIFICATE OF CORRECTION

PATENT NO. : 5,320,684
DATED : June 14, 1994
INVENTOR(S) : James Amick et al.

It is certified that error appears in the above-indentified patent and that said Letters Patent is hereby corrected as shown below:

Claim 35, column 18, line 55, change "so" to -- to --.

Signed and Sealed this

Twentieth Day of September, 1994

Attest:

BRUCE LEHMAN

Attesting Officer         Commissioner of Patents and Trademarks